US009547383B1

(12) United States Patent
Lee et al.

(10) Patent No.: US 9,547,383 B1
(45) Date of Patent: Jan. 17, 2017

(54) TOUCH PANEL

(71) Applicant: CANDO CORPORATION, Taichung (TW)

(72) Inventors: Wen-Chen Lee, Hsinchu County (TW); Chia-Ming Yeh, Taoyuan (TW); Wan-Chun Hsu, Hsinchu County (TW)

(73) Assignee: CANDO CORPORATION, Taichung (TW)

( * ) Notice: Subject to any disclaimer, the term of this patent is extended or adjusted under 35 U.S.C. 154(b) by 0 days.

(21) Appl. No.: 14/857,838

(22) Filed: Sep. 18, 2015

(30) Foreign Application Priority Data

Jun. 25, 2015 (TW) ................................ 104120506 A
Jul. 30, 2015 (TW) ................................ 104124770 A

(51) Int. Cl.
 *G06F 3/041* (2006.01)
 *H05K 1/02* (2006.01)
 *G06F 1/16* (2006.01)

(52) U.S. Cl.
 CPC .............. *G06F 3/041* (2013.01); *G06F 1/16* (2013.01); *H05K 1/0274* (2013.01); *H05K 1/0296* (2013.01); *G06F 2203/04112* (2013.01)

(58) Field of Classification Search
 CPC .... G06F 3/04865; G06F 3/0487; G06F 3/044; G06F 3/04875; G06F 3/045
 USPC ........ 345/173–179; 178/18.01–18.04; 349/5, 349/10, 12, 110
 See application file for complete search history.

(56) References Cited

U.S. PATENT DOCUMENTS

| 2006/0061262 | A1* | 3/2006 | Yoo ...................... H01L 27/3253 313/503 |
| 2012/0044191 | A1* | 2/2012 | Shin ........................ G06F 3/044 345/174 |
| 2012/0139871 | A1* | 6/2012 | Ku .......................... G06F 3/044 345/174 |
| 2013/0050137 | A1* | 2/2013 | Yang ....................... G06F 3/044 345/174 |
| 2014/0071064 | A1* | 3/2014 | Cho ........................ G06F 3/044 345/173 |
| 2014/0139481 | A1* | 5/2014 | Han ........................ G06F 3/044 345/174 |
| 2014/0204043 | A1* | 7/2014 | Lin ....................... G06F 3/0416 345/173 |

(Continued)

FOREIGN PATENT DOCUMENTS

TW 200915151 4/2009
TW I482061 4/2015

*Primary Examiner* — Kimnhung Nguyen
(74) *Attorney, Agent, or Firm* — Jianq Chyun IP Office

(57) ABSTRACT

A touch panel including a substrate, plural first electrode strings, plural second electrode strings, plural insulating patterns, and plural first optical matching patterns is provided. The substrate has plural bridge areas and a non-bridge area connected to the bridge areas. The first electrode strings and the second electrode strings are disposed on the substrate and staggered in the bridge areas. The insulating patterns are located in the bridge areas, and each of the insulating patterns is located between one of the first electrode strings and a corresponding second electrode string respectively. Each of the first optical matching patterns is located in one of the bridge areas respectively and located between a corresponding first electrode string and a corresponding second electrode string. Each of the insulating patterns is respectively disposed on a surface of one of the first optical matching patterns facing away from the substrate.

15 Claims, 3 Drawing Sheets

(56) References Cited

U.S. PATENT DOCUMENTS

| | | | | |
|---|---|---|---|---|
| 2014/0362308 A1* | 12/2014 | Chen | ................... | G06F 3/041 |
| | | | | 349/12 |
| 2015/0002756 A1* | 1/2015 | Kim | ................... | G06F 3/0412 |
| | | | | 349/12 |
| 2015/0109245 A1* | 4/2015 | Chou | ................... | G06F 3/044 |
| | | | | 345/174 |
| 2015/0220185 A1* | 8/2015 | Kim | ................... | G06F 3/044 |
| | | | | 345/174 |

* cited by examiner

TOUCH PANEL

CROSS-REFERENCE TO RELATED APPLICATION

This application claims the priority benefits of Taiwan application serial no. 104120506, filed on Jun. 25, 2015, and Taiwan application serial no. 104124770, filed on Jul. 30, 2015. The entirety of each of the above-mentioned patent applications is hereby incorporated by reference herein and made a part of this specification.

BACKGROUND

Technical Field

The invention relates to a panel. Particularly, the invention relates to a touch panel.

Related Art

Touch panel generally includes a substrate and a plurality of electrode strings disposed on the substrate in stagger. A material of the electrode strings is generally a transparent conductive material with a good light transmittance, so as to improve a light transmittance of the touch panel. Since a reflectivity difference between an area where single layer electrode strings are located and staggered positions of the electrode strings is very large, when a user uses the touch panel, it is easy for the user to see a bridge trace at the staggered positions of the electrode strings, which influences a visual effect of the touch panel. Although some amelioration has been made according to the existing techniques, the amelioration cannot effectively improve the visual effect of the touch panel.

SUMMARY

The invention is directed to a touch panel, which has good visual effect.

The invention provides a touch panel including a substrate, a plurality of first electrode strings, a plurality of second electrode strings, a plurality of insulating patterns, and a plurality of first optical matching patterns. The substrate has a plurality of bridge areas and a non-bridge area connected to the bridge areas. The first electrode strings and the second electrode strings are disposed on the substrate and are staggered in the bridge areas. The insulating patterns are located in the bridge areas, and each of the insulating patterns is located between one of the first electrode strings and a corresponding second electrode string respectively. Each of the first optical matching patterns is located in one of the bridge areas respectively and located between a corresponding first electrode string and a corresponding second electrode string. Each of the insulating patterns is respectively disposed on a surface of one of the first optical matching patterns facing away from the substrate.

In an exemplary embodiment o the invention, each of the first electrode strings includes a plurality of first electrode pads and a plurality of first connection lines. Each of the first connection lines connects two adjacent first electrode pads in series along a first direction. Each of the second electrode strings includes a plurality of second electrode pads and a plurality of second connection lines. Each of the second connection lines connects two adjacent second electrode pads in series along a second direction. Each of the second connection lines and the corresponding first connection line are staggered in one of the bridge areas. Each of the insulating patterns and the corresponding first optical matching patterns are respectively located between one of the first connection lines and the corresponding second connection line.

In an exemplary embodiment of the invention, the second connection lines, the first optical matching patterns, the insulating patterns and the first connection lines are sequentially stacked on the substrate, and the first electrode pads, the second electrode pads and the first connection lines belong to a same layer.

In an exemplary embodiment of the invention, a width of each of the first optical matching patterns along the second direction is greater than a width of each of the first connection lines along the second direction and is smaller than a length of each of the second connection lines.

In an exemplary embodiment of the invention, a thickness of each of the insulating patterns is greater than 1 μm and smaller than or equal to 5 μm.

In an exemplary embodiment of the invention, shapes of the first optical matching patterns and the insulating patterns are the same.

In an exemplary embodiment of the invention, a shape of each of the first optical matching patterns is different to a shape of each of the first electrode strings or each of the second electrode strings.

In an exemplary embodiment of the invention, each of the first optical matching patterns is a single layer structure. A refractive index of each of the first optical matching patterns ranges between 1.55 and 1.8, and a thickness of each of the first optical matching patterns ranges between 10 Å and 2000 Å.

In an exemplary embodiment of the invention, each of the first optical matching patterns includes at least one first sub layer and at least one second sub layer. The at least one first sub layer and the at least one second sub layer are stacked in alternation between the substrate and the corresponding insulating pattern. A refractive index of each of the first sub layers is lower than a refractive index of each of the second sub layer, and a thickness of each of the first sub layers and each of the second sub layers respectively ranges between 10 Å and 2000 Å.

In an exemplary embodiment of the invention, the refractive index of each of the first sub layers ranges between 1.4 and 1.8, and the refractive index of each of the second sub layers ranges between 1.8 and 3.

In an exemplary embodiment of the invention, the touch panel further includes a second optical matching layer. The second optical matching layer is disposed on the substrate and located in the bridge areas and the non-bridge area, and the second optical matching layer is located between the first electrode strings and the substrate and between the second electrode strings and the substrate.

In an exemplary embodiment of the invention, the touch panel further includes a third optical matching layer. The third optical matching layer is located in the bridge areas and the non-bridge area and is disposed on the first electrode strings and the second electrode strings, wherein a thickness of the third optical matching layer in each of the bridge areas is A, and a thickness of the third optical matching layer in the non-bridge area is B, and (B−A)≤0.1B.

In an embodiment of the invention, the third optical matching layer is an organic material layer with a refractive index ranging between 1.6 and 1.7.

In an embodiment of the invention, a thickness of the third optical matching layer at a boundary of the non-bridge area and the bridge areas is C, and C is greater than A and B.

In an embodiment of the invention, 2≤C/B≤5.

According to the above descriptions, since the first optical matching pattern disposed in the bridge areas avails compensating a reflectivity difference between the area where the single layer electrode strings are located (the non-bridge area) and the staggered positions of the electrode strings (the bridge areas), the touch panel of the invention has a good visual effect.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
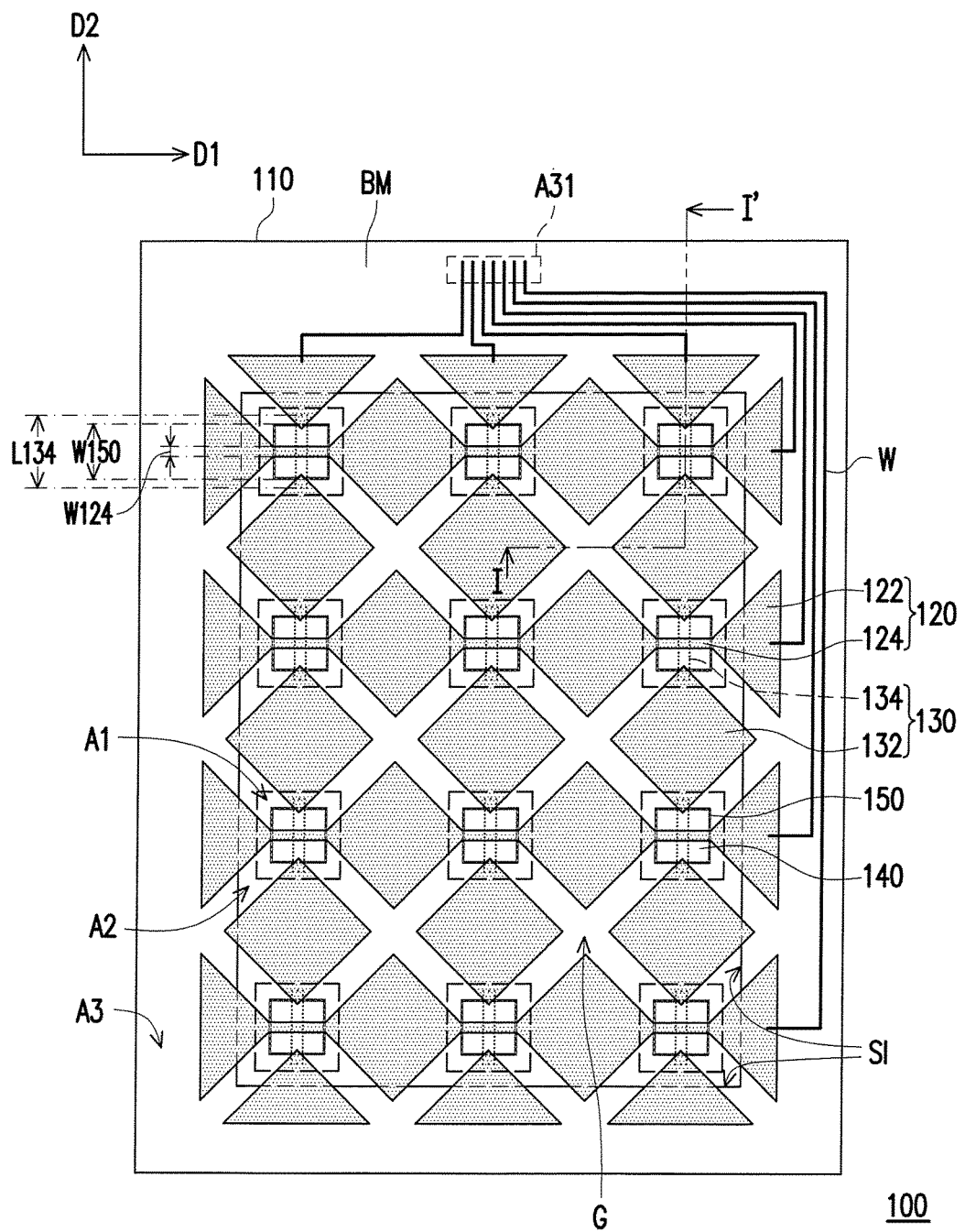
FIG. 1A is a top view of a touch panel according to an embodiment of the invention.
Figure 1B:
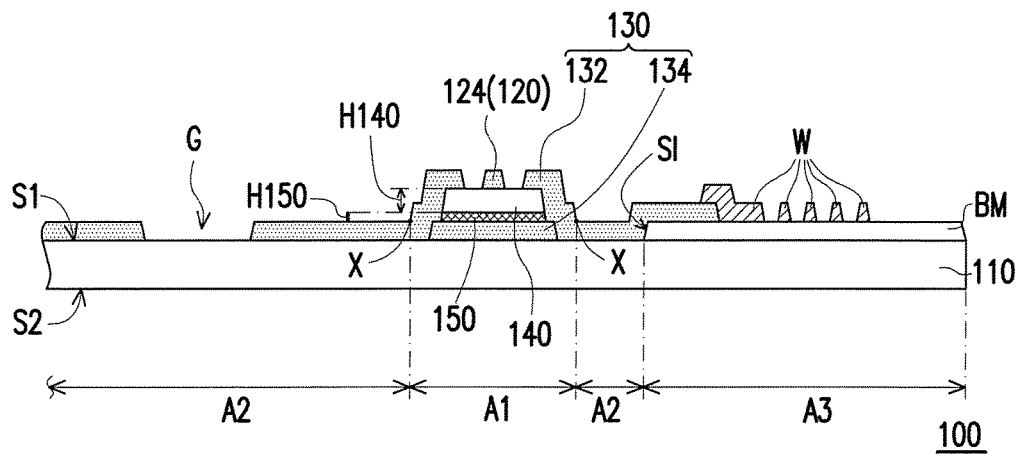
FIG. 1B is a first cross-sectional view of FIG. 1A along a section line I-I'.

FIG. 1A is a top view of a touch panel according to an embodiment of the invention. FIG. 1B is a first cross-sectional view of FIG. 1A along a section line I-I'. Referring to FIG. 1A and FIG. 1B, the touch panel 100 includes a substrate 110, a plurality of first electrode strings 120, a plurality of second electrode strings 130, a plurality of insulating patterns 140, and a plurality of first optical matching patterns 150.

The substrate 110 is adapted to carry the first electrode strings 120, the second electrode strings 130, the insulating patterns 140 and the first optical matching patterns 150. In the present embodiment, the substrate 110 is, for example, a cover plate, wherein the first electrode strings 120, the second electrode strings 130, the insulating patterns 140 and the first optical matching patterns 150 are disposed on an inner surface S1 of the substrate 110, and an outer surface S2 of the substrate 110 is a touch operation surface. Namely, a touch object (for example, a finger or a stylus) touches the outer surface S2 or executes a suspending operation above the outer surface S2.

The substrate 110 can be a rigid substrate with a high mechanical strength to protect the covered components (for example, scratch proof). When the touch panel 100 is required to be combined with a display panel for utilization, a material of the substrate 110 is a transparent material to avoid shielding a display beam coming from the display panel. The transparent material generally refers to a material with a high transmittance, and is not limited to materials with a transmittance of 100%. For example, the substrate 110 can be a transparent tempered glass substrate, though the invention is not limited thereto.

The substrate 110 has a plurality of bridge areas A1 and a non-bridge area A2 connected to the bridge areas A1. The first electrode strings 120 and the second electrode strings 130 are disposed on the substrate 110 and are staggered in the bridge areas A1. Specifically, boundaries of the bridge areas A1 and the non-bridge area A2 are, for example, defined by positions X (shown in FIG. 1B) protruding due to staggering of the first electrode string 120 and the second electrode string 130.

In the present embodiment, the substrate 110 may further have a peripheral area A3 surrounding the non-bridge area A2, so as to configure a plurality of wires W for transmitting signals and other circuits that are not shown. Each of the wires W is electrically connected to one of the first electrode strings 120 or one of the second electrode strings 130, and the wires W concentratedly extend into a bonding area A31 of the peripheral area A3 for bonding with a signal transmission circuit (not shown) or a chip (not shown). In order to avoid revealing the wires W and the circuit to influence a visual effect of the display panel 100, the touch panel 100 can be further configured with a black matrix layer BM to shield the wires W and circuit. As shown in FIG. 1A, the black matrix layer BM covers the peripheral area A3 and exposes the bridge areas A1 and the non-bridge area A2, wherein a boundary of the peripheral area A3 and the non-bridge area A2 is defined by an inner edge SI of the black matrix layer BM.

Each of the first electrode strings 120 includes a plurality of first electrode pads 122 and a plurality of first connection lines 124. Each of the first connection lines 124 connects two adjacent first electrode pads 122 in series along a first direction D1. Each of the second electrode strings 130 includes a plurality of second electrode pads 132 and a plurality of second connection lines 134. Each of the second connection lines 134 connects two adjacent second electrode pads 132 in series along a second direction D2, and each of the second connection lines 134 and the corresponding first connection line 124 are staggered in one of the bridge areas A1. The second direction D2 and the first direction D1 are intersected and are, for example, perpendicular to each other. It should be noted that FIG. 1A only schematically illustrates one of the pattern designs of the electrode strings (including the first electrode strings 120 and the second electrode strings 130), and the invention is not limited thereto.

The first electrode string 120 and the second electrode string 130 may adopt a transparent conductive material, for example, metal oxide, though the invention is not limited thereto. The metal oxide, for example, includes indium tin oxide, indium zinc oxide, aluminium tin oxide, aluminium zinc oxide or zinc indium germanium oxide, etc.

The insulating patterns 140 are located in the bridge areas A1, and each of the insulating layers 140 is respectively located between one of the first electrode strings 120 and the corresponding second electrode string 130. As shown in FIG. 1B, each of the insulating pattern 140 is located at a stagger position of the first electrode string 120 and the second electrode string 130, and is located between one of the first connection lines 124 and the corresponding second connection line 134 to structurally separate the first connection line 124 and the second connection line 134. In this way, a short circuit between the first connection line 124 and the second connection line 134 due to mutual contact is avoided. A thickness H140 of each of the insulating patterns 140 is, for example, greater than 1 μm and smaller than or equal to 5 μm.

Each of the first optical matching patterns 150 is located in one of the bridge areas A1 respectively and located between a corresponding first electrode string 120 and a corresponding second electrode string 130. As shown in FIG. 1B, each of the first optical matching patterns 150 is respectively located at the staggered position of the first electrode string 120 and the second electrode string 130, and is located between one of the first connection lines 124 and the corresponding second connection line 134. Each of the insulating patterns 140 is respectively disposed on a surface of one of the first optical matching patterns 150 facing away from the substrate 110. Namely, the first optical matching pattern 150 is closer to the touch operation surface (i.e. the outer surface S2) compared with the insulation pattern 140.

In the present embodiment, the second connection lines 134, the first optical matching patterns 150, the insulating patterns 140 and the first connection lines 124 are sequentially stacked on the substrate 110, and the first electrode pads 122 (shown in FIG. 1A), the second electrode pads 132 and the first connection lines 124 belong to a same layer. Namely, the first electrode pads 122, the second electrode pads 132 and the first connection lines 124 are manufactured through a same manufacturing process. However, a stacking sequence of the above film layers is not limited thereto. In another embodiment, the first connection lines 124, the first optical matching patterns 150, the insulating patterns 140 and the second connection lines 134 can be sequentially stacked on the substrate 110, and the first electrode pads 122, the second electrode pads 132 and the first connection lines 124 belong to a same layer. In other words, the first electrode pads 122, the second electrode pads 132 and the first connection lines 124 are first formed on the substrate 110, and then the first optical matching patterns 150, the insulating patterns 140 and the second connection lines 134 are sequentially formed.

As shown in FIG. 1B, each of the first optical matching patterns 150 can be a single layer structure. By modulating a thickness H150 of the first optical matching pattern 150, and making a refractive index of the first optical matching pattern 150 to be between a refractive index of the electrode strings (including the first electrode strings 120 and the second electrode strings 130) and a refractive index of the insulating patterns 140, reflectivity of the area where the first optical matching pattern 150 is located may be effectively decreased based on destructive interference of light. In the present embodiment, the thickness H150 of each of the first optical matching patterns 150 may range between 10 Å and 2000 Å, and the refractive index thereof may range between 1.55 and 1.8. A manufacturing method of the first optical matching pattern 150 can be a photolithography process, or after a film coating process, a dry etching process or a wet etching process is performed for patterning, so as to form the first optical matching patterns 150. However, the material and the manufacturing method of the first optical matching patterns 150 are not limited to the above description.

In order to regionally adjust the reflectivity of the touch panel 100, the first optical matching patterns 150 of the present embodiment are only set in the bridge areas A1, and do not cover the non-bridge area A2. In this way, by modulating the refractive index and the thickness H150 of the first optical matching patterns 150, a reflectivity difference between the area where the single layer electrode strings are located (the non-bridge area A2) and the staggered positions of the electrode strings (the bridge areas A1) is compensated, such that the reflectivity of the bridge areas A1 is equal or close to the reflectivity of the non-bridge area A2, and thus visibility of a bridge trace in the bridge areas A1 is decreased, and the touch panel 100 may have a good visual effect.

As shown in FIG. 1A, the first optical matching patterns 150 and the insulating patterns 140 present a one-to-one configuration relationship, wherein a width W150 of each of the first optical matching patterns 150 along the second direction D2 is greater than a width W124 of each of the first connection lines 124 along the second direction D2 and is smaller than a length L134 of each of the second connection lines 134. A shape of the first optical matching patterns 150 can be the same to a shape of the insulating patterns 140, and the shape of each of the first optical matching patterns 150 is different to a shape of each of the first electrode strings 120 or each of the second electrode strings 130. For example, orthogonal projections of the first optical matching patterns 150 and the insulating patterns 140 on the substrate 110 are all rectangles, while a size of the first optical matching pattern 150 can be slightly greater than a size of the insulating pattern 140, though the invention is not limited thereto. In other embodiments, the size of the first optical matching pattern 150 can also be equal to or slightly smaller than the size of the insulating pattern 140.

Figure 2:
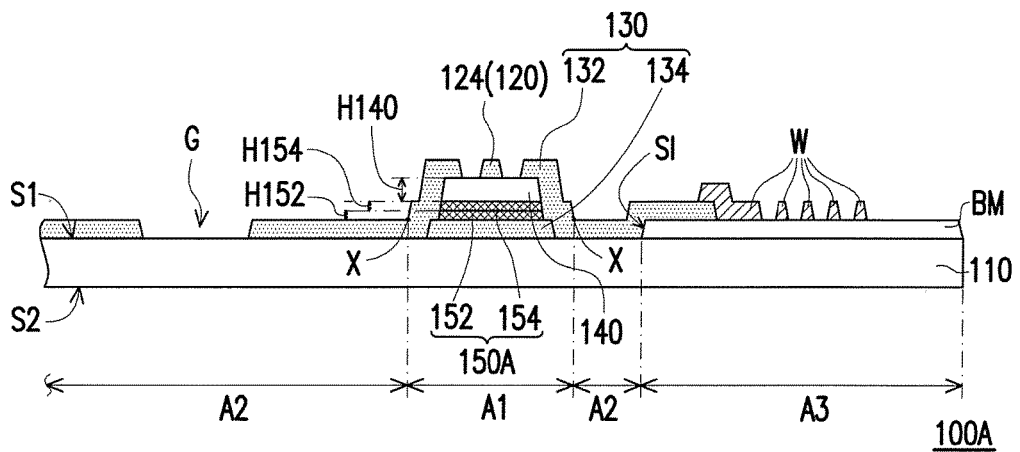
FIG. 2 to FIG. 6 are respectively second to sixth cross-sectional views of FIG. 1A along the section line I-I'.

FIG. 2 to FIG. 6 are respectively second-sixth cross-sectional views of FIG. 1A along the section line I-I'. Referring to FIG. 2, the touch panel 100A is similar to the touch panel 100 of FIG. 1B, and the similar or same components are denoted by the same referential numbers, and details thereof are not repeated. A main difference between the touch panel 100A and the touch panel 100 is that each of the first optical matching patterns 150A includes at least one first sub layer 152 and at least one second sub layer 154. In the present embodiment, the number of the first sub layer 152 and the second sub layer 154 are respectively 1, and the first sub layer 152 and the second sub layer 154 are sequentially stacked between the substrate 110 and the corresponding insulating pattern 140, and are located between the insulating layer 140 and the second connection line 134.

By modulating a thickness H152 of the first sub layer 152 and a thickness H154 of the second sub layer 154, and based on a high-low refractive index stacking design, the reflectivity of the area where the first optical matching pattern 150A is located can be effectively decreased, such that the reflectivity difference between the bridge areas A1 and the non-bridge area A2 approaches 0. The aforementioned high and low refractive index stacking design is, for example, to make a refractive index of the second connection line 134 to be greater than a refractive index of the first sub layer 152, and make the refractive index of the first sub layer 152 to be lower than a refractive index of the second sub layer 154, and make the refractive index of the second sub layer 154 to be higher than a refractive index of the insulating pattern 140. For example, the refractive index of the first sub layer 152 may range between 1.4 and 1.8, and the refractive index of the second sub layer 154 may range between 1.8 and 3. A material of the first sub layer 152 may include $SiO_2$, and a material of the second sub layer 154 may include $Nb_2O_5$, $TiO_2$, $ZrO_2$, $SiN_x$ or $SiO_xN_y$, though the invention is not limited thereto. Moreover, the thickness H152 of the first sub layer 152 and the thickness H154 of the second sub layer 154 may respectively range between 10 Å and 2000 Å.

Figure 3:
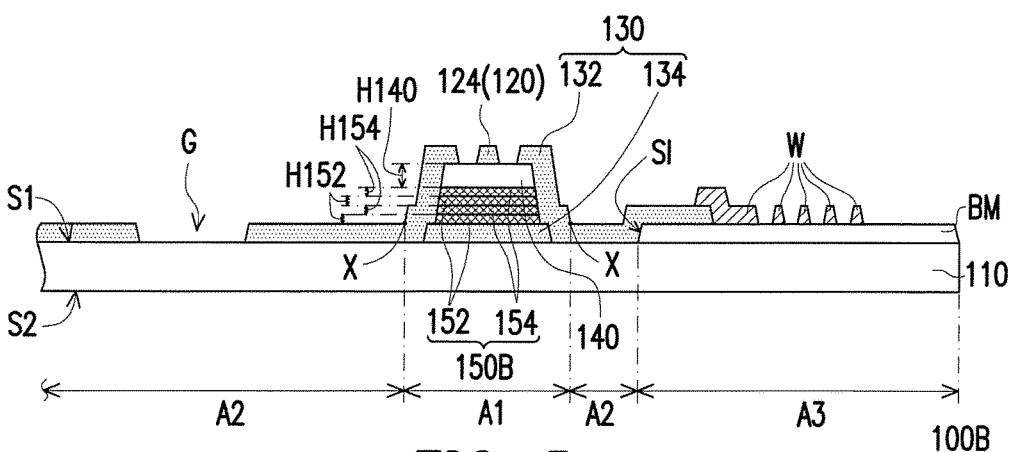

Referring to FIG. 3, the touch panel 100B is similar to the touch panel 100A of FIG. 2, and the similar or same components are denoted by the same referential numbers, and details thereof are not repeated. A main difference between the touch panel 100B and the touch panel 100A is that the numbers of the first sub layers 152 and the second sub layers 154 of the first optical matching pattern 150B are respectively greater than 1 (for example, are respectively 2), and the first sub layers 152 and the second sub layers 154 are alternately stacked between the substrate 110 and the corresponding insulating pattern 140, and are located between the insulating pattern 140 and the second connection line 134. The material of the first sub layer 152 and the second sub layer 154 may refer to the aforementioned description, and detail thereof is not repeated.

Figure 4:
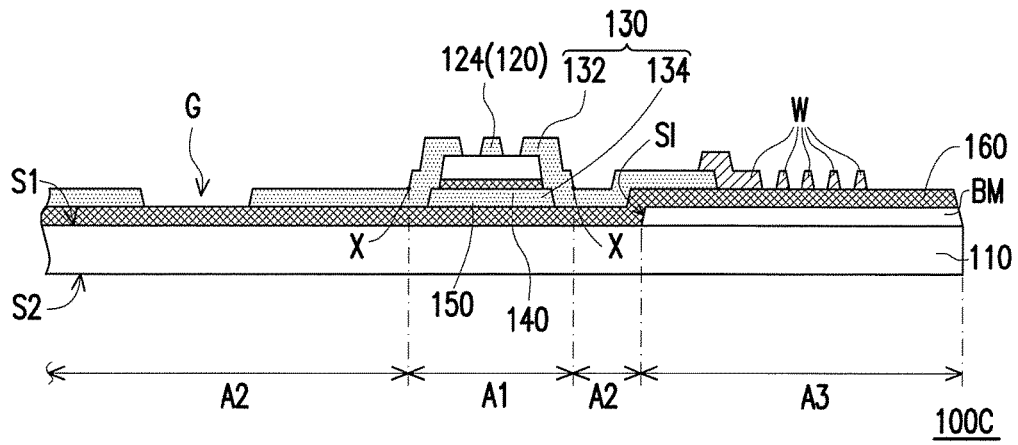

Referring to FIG. 4, the touch panel 100C is similar to the touch panel 100 of FIG. 1B, and the similar or same components are denoted by the same referential numbers, and details thereof are not repeated. A main difference between the touch panel 100C and the touch panel 100 is that the touch panel 100C further includes a second optical matching layer 160. The second optical matching layer 160 is disposed on the substrate 110 and is located in the bridge areas A1 and the non-bridge area A2, and the second optical matching layer 160 is located between the first electrode strings 120 and the substrate 110 and between the second electrode strings 130 and the substrate 110. Specifically, the second optical matching layer 160 can be directly disposed on the inner surface S1 of the substrate 110, and the first electrode strings 120 and the second electrode strings 130 are disposed on the second optical matching layer 160.

A refractive index of the second optical matching layer 160 is, for example, between a refractive index of the substrate 110 and a refractive index of the electrode strings (including the first electrode strings 120 and the second electrode strings 130) for compensating a reflectivity difference between a gap G between the electrode strings and the area where the single layer electrode strings are located (the area in the non-bridge area A2 except for the gap G), so as to mitigate the conventional problem of pattern visibility. For example, the refractive index of the second optical matching layer 160 may range between 1.6 and 1.7.

The second optical matching layer 160 can be a single layer structure or a multi-layer structure. Specifically, the second optical matching layer 160 may include at least one organic material layer, at least one inorganic material layer or a stacked layer of the above two layers. When the second optical matching layer 160 is a stacked layer of a plurality of sub layers, refractive indexes of the sub layers arranged in a sequence from the substrate 110 to the second connection line 134 may adopt a high-low or high-low-high-low design, wherein the sub layer closest to the inner surface S1 adopts a material with a high refractive index, and the sub layer closest to the second connection line 134 adopts a material with a low refractive index. In this way, the second optical matching layer 160 and the second connection line 134 located thereon, the first optical matching pattern 150 and the insulating pattern 140 may still have the aforementioned high-low refractive index stacking design.

Moreover, the second optical matching layer 160 may selectively extend to the peripheral area A3, and is located between the black matrix layer BM and the wires W, though the invention is not limited thereto. It should be noted that the second optical matching layer 160 extended to the peripheral area A3 is required to expose the bonding area A31 (shown in FIG. 1A) in the peripheral area A3, so as to facilitate bonding the wires W in the bonding area A31 with a signal transmission circuit (not shown) or a chip (not shown).

Figure 5:
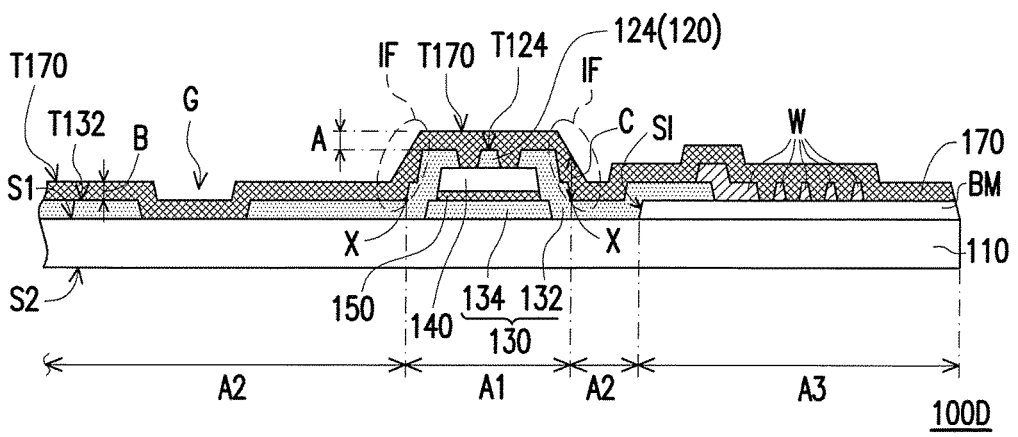

Referring to FIG. 5, the touch panel 100D is similar to the touch panel 100 of FIG. 1B, and the similar or same components are denoted by the same referential numbers, and details thereof are not repeated. A main difference between the touch panel 100D and the touch panel 100 of FIG. 1B is that the touch panel 100D further includes a third optical matching layer 170. The third optical matching layer 170 is located in the bridge areas A1 and the non-bridge area A2, and is disposed on the first electrode strings 120 and the second electrode strings 130.

A refractive index of the third optical matching layer 170 can be between the refractive index of the substrate 110 and the refractive index of the electrode strings (including the first electrode string 120 and the second electrode string 130), so as to compensate a reflectivity difference between the gap G between the electrode strings and the area where the single layer electrode strings are located (the area in the non-bridge area A2 except for the gap G), so as to mitigate the conventional problem of pattern visibility. For example, the refractive index of the third optical matching layer 170 ranges between 1.6 and 1.7.

Moreover, to make a thickness A of the third optical matching layer 170 at the bridge areas A1 to be consistent with a thickness B of the third optical matching layer 170 at the non-bridge area A2, for example, to make (B−A)≤0.1B, the reflectivity difference between the area where the single layer electrode strings are located (the non-bridge area A2) and the staggered positions of the electrode strings (the bridge areas A1) can be further compensated, so as to decrease visibility of the bridge trace in the bridge areas A1, and thus the touch panel 100D may have a good visual effect. The thickness A is defined as a distance between a top surface T170 of the third optical matching layer 170 and a top surface T124 of the first connection line 124 in the bridge areas A1, and the thickness B is defined as a distance between the top surface T170 of the third optical matching layer 170 that is not protruded due to staggering of the electrode strings and a top surface T132 of the second electrode pad 132 (or a top surface of the first electrode pad 122) in the non-bridge area A2.

Since a film layer thickness of the bridge areas A1 is greater than a film layer thickness of the non-bridge area A2, when the third optical matching layer 170 is formed by curing a liquid material (for example, a liquid organic material), the liquid material is liable to flow from the bridge areas A1 towards the non-bridge area A2 before the liquid material is cured, such that the thickness B of the third optical matching layer 170 at the non-bridge area A2 is liable to be greater than the thickness A of the third optical matching layer 170 at the bridge areas A1, and a thickness C of the third optical matching layer 170 at boundaries IF of the non-bridge area A2 and the bridge areas A1 is greater than the thickness A and the thickness B. In the present embodiment, $$2 \le \frac{C}{B} \le 5.$$

The aforementioned boundaries IF are defined as inclined positions of the third optical matching layer 170 between the non-bridge area A2 and the bridge areas A1 caused by a thickness step difference of films therebelow.

In order to make the thickness A of the third optical matching layer 170 at the bridge areas A1 and the thickness B of the third optical matching layer 170 at the non-bridge area A2 to be consistent, in the present embodiment, a flowability of the organic material can be decreased by increasing a viscosity of the organic material, decreasing a levelling property of the organic material or decreasing a surface tension of the organic material. For example, the viscosity of the organic material can be design to be greater than 5 centipoises and less than 50 centipoises, or the surface tension of the organic material can be designed to be smaller than a surface tension of the material of each of the insulating patterns 140. Alternatively, when the third optical matching layer 170 is formed through printing, the flowability of the organic material can be decreased by reducing a moving speed difference between a printing appliance (for example, a roller) and the substrate 110, so as to implement (B−A)≤0.1B.

Figure 6:
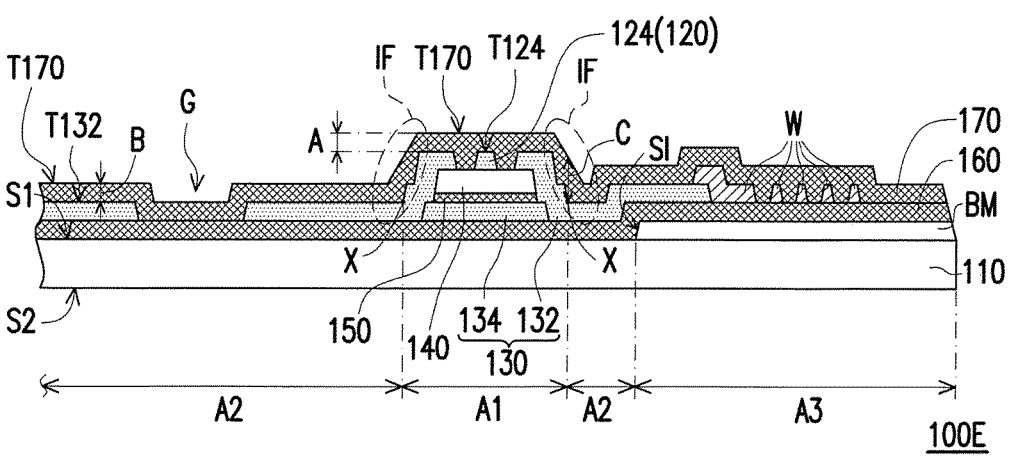

Referring to FIG. 6, the touch panel 100E is similar to the touch panel 100C of FIG. 4, and the similar or same components are denoted by the same referential numbers, and details thereof are not repeated. A main difference between the touch panel 100E and the touch panel 100C is that the touch panel 100E further includes the third optical matching layer 170. The material, the configuration position and effects of the third optical matching layer 170 may refer to the corresponding description of FIG. 5, and details thereof are not repeated.

In summary, in the invention, the first optical matching pattern is disposed in the bridge areas to compensate a reflectivity difference between the area where the single layer electrode strings are located (the non-bridge area) and the staggered positions of the electrode strings (the bridge areas), the touch panel of the invention may have a good visual effect. In an embodiment, at least one of the second optical matching layer and the third optical matching layer can be further configured to compensate the reflectivity difference between the gap between the electrode strings and the area where the single layer electrode strings are located, so as to mitigate the conventional problem of pattern visibility, and make the reflectivity of the gap between the electrode strings, the reflectivity of the area where the single layer electrode strings are located and the reflectivity at the staggered positions of the electrode strings to be consistent, and thus the touch panel may have an ideal visual effect.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A touch panel, comprising:
   a substrate, having a plurality of bridge areas and a non-bridge area connected to the bridge areas;
   a plurality of first electrode strings and a plurality of second electrode strings, disposed on the substrate and staggered in the bridge areas;
   a plurality of insulating patterns, located in the bridge areas, and each of the insulating patterns being located between one of the first electrode strings and a corresponding second electrode string respectively; and
   a plurality of first optical matching patterns, wherein each of the first optical matching patterns is located in one of the bridge areas respectively and located between a corresponding first electrode string and a corresponding second electrode string, and each of the insulating patterns is respectively disposed on a surface of one of the first optical matching patterns facing away from the substrate.

2. The touch panel as claimed in claim 1, wherein each of the first electrode strings comprises a plurality of first electrode pads and a plurality of first connection lines, and each of the first connection lines connects two adjacent first electrode pads in series along a first direction, each of the second electrode strings comprises a plurality of second electrode pads and a plurality of second connection lines, and each of the second connection lines connects two adjacent second electrode pads in series along a second direction, each of the second connection lines and the corresponding first connection line are staggered in one of the bridge areas, and each of the insulating patterns and the corresponding first optical matching patterns are respectively located between one of the first connection lines and the corresponding second connection line.

3. The touch panel as claimed in claim 2, wherein the second connection lines, the first optical matching patterns, the insulating patterns and the first connection lines are sequentially stacked on the substrate, and the first electrode pads, the second electrode pads and the first connection lines belong to a same layer.

4. The touch panel as claimed in claim 2, wherein a width of each of the first optical matching patterns along the second direction is greater than a width of each of the first connection lines along the second direction and is smaller than a length of each of the second connection lines.

5. The touch panel as claimed in claim 1, wherein a thickness of each of the insulating patterns is greater than 1 µm and smaller than or equal to 5 µm.

6. The touch panel as claimed in claim 1, wherein shapes of the first optical matching patterns and the insulating patterns are the same.

7. The touch panel as claimed in claim 1, wherein a shape of each of the first optical matching patterns is different to a shape of each of the first electrode strings or each of the second electrode strings.

8. The touch panel as claimed in claim 1, wherein each of the first optical matching patterns is a single layer structure, a refractive index of each of the first optical matching patterns ranges between 1.55 and 1.8, and a thickness of each of the first optical matching patterns ranges between 10 Å and 2000 Å.

9. The touch panel as claimed in claim 1, wherein each of the first optical matching patterns comprises at least one first sub layer and at least one second sub layer, the at least one first sub layer and the at least one second sub layer are stacked in alternation between the substrate and the corresponding insulating pattern, a refractive index of each of the first sub layers is lower than a refractive index of each of the second sub layer, and a thickness of each of the first sub layers and each of the second sub layers respectively ranges between 10 Å and 2000 Å.

10. The touch panel as claimed in claim 9, wherein the refractive index of each of the first sub layers ranges between 1.4 and 1.8, and the refractive index of each of the second sub layers ranges between 1.8 and 3.

11. The touch panel as claimed in claim 1, further comprising:
    a second optical matching layer, disposed on the substrate and located in the bridge areas and the non-bridge area, and the second optical matching layer being located between the first electrode strings and the substrate and between the second electrode strings and the substrate.

12. The touch panel as claimed in claim 1, further comprising:
    a third optical matching layer, located in the bridge areas and the non-bridge area and disposed on the first electrode strings and the second electrode strings, wherein a thickness of the third optical matching layer in each of the bridge areas is A, and a thickness of the third optical matching layer in the non-bridge area is B, and (B−A)≤0.1B.

13. The touch panel as claimed in claim 12, wherein the third optical matching layer is an organic material layer with a refractive index ranging between 1.6 and 1.7.

14. The touch panel as claimed in claim 12, wherein a thickness of the third optical matching layer at a boundary of the non-bridge area and the bridge areas is C, and C is greater than A and B.

15. The touch panel as claimed in claim 14, wherein $$2 \leq \frac{C}{B} \leq 5.$$

* * * * *